US007069160B2

(12) United States Patent
Cecil

(10) Patent No.: US 7,069,160 B2
(45) Date of Patent: Jun. 27, 2006

(54) INTRUSION DETECTION SYSTEM AND METHOD THEREOF

(76) Inventor: Kenneth B. Cecil, 3184 Sage Glen, Escondido, CA (US) 92029

(*) Notice: Subject to any disclaimer, the term of this patent is extended or adjusted under 35 U.S.C. 154(b) by 51 days.

(21) Appl. No.: 10/929,417

(22) Filed: Aug. 31, 2004

(65) Prior Publication Data

US 2006/0047448 A1 Mar. 2, 2006

(51) Int. Cl.
*G01R 31/00* (2006.01)
*G08B 13/00* (2006.01)

(52) U.S. Cl. ........................................ 702/59; 340/541

(58) Field of Classification Search .................. 702/59; 340/552, 541, 572.1, 572.4, 564
See application file for complete search history.

(56) References Cited

U.S. PATENT DOCUMENTS 4,213,122 A 7/1980 Rotman et al. ............. 340/552
4,588,988 A 5/1986 Karas ......................... 340/552
4,879,544 A * 11/1989 Maki et al. ................. 340/552
4,887,069 A * 12/1989 Maki et al. ................. 340/552
5,049,858 A * 9/1991 Price .......................... 340/552
5,093,639 A 3/1992 Franchi et al. ............ 333/24 R
5,406,263 A 4/1995 Tuttle ...................... 340/572.1
5,446,446 A 8/1995 Harman ....................... 340/566
5,510,766 A * 4/1996 Harman et al. ............. 340/552
5,581,236 A * 12/1996 Hoseit et al. ............... 340/511
5,581,237 A * 12/1996 DiPoala ...................... 340/554
5,682,143 A 10/1997 Brady et al. ............. 340/572.7
5,781,108 A * 7/1998 Jacob et al. ................ 340/552
5,936,524 A * 8/1999 Zhevelev et al. ........... 340/552
6,188,318 B1 * 2/2001 Katz et al. ............... 340/545.3
6,424,259 B1 * 7/2002 Gagnon ...................... 340/554
6,577,236 B1 * 6/2003 Harman ...................... 340/552
6,731,210 B1 * 5/2004 Swanson et al. ............ 340/566
6,888,459 B1 * 5/2005 Stilp .......................... 340/541

OTHER PUBLICATIONS

Maki et al., CWD Sensors for Intrusion Detection Systems-An Updated, 1995 IEEE, pp. 317-324.*
Birch, A., Advantages of Redeployable & Relocatable Security Systems, 1994 IEEE, pp. 180-184.*

* cited by examiner

*Primary Examiner*—John Barlow
*Assistant Examiner*—Toan M. Le
(74) *Attorney, Agent, or Firm*—Hoffman, Wasson & Gitler, PC

(57) ABSTRACT

An intrusion detection system and method utilizing a power transmission cable connected to a source of radio frequency signals. A data transmission cable is associated with the power transmission cable and is provided with a plurality of radio frequency identification chips. The power transmission cable would induce an electromagnetic field within the data transmission cable allowing each of the RFID chips to transmit a signal during normal operation. However, if an intrusion occurs or the power transmission cable or data transmission cable is severed, the system according to the present invention, would be able to determine the exact point of intrusion based upon the signals received or not received from the RFID chips.

28 Claims, 9 Drawing Sheets

INTRUSION DETECTION SYSTEM AND METHOD THEREOF

FIELD OF THE INVENTION

The present invention relates generally to systems and devices for providing security to a particular area or structure.

BACKGROUND OF THE INVENTION

The field of protecting an individual's personal property as well as industrial/commercial real estate has mushroomed in the last 20 or 25 years from a multi-million to a multi-billion dollar industry. Initially, this industry concerned itself with protecting structures, such as homes or businesses from intrusion, particularly by thieves or other nefarious individuals. Generally, entry points to the particular structure, such as doors or windows were wired in a manner such as to produce a signal if the door or windows were opened without shutting off an alarm. Similarly, if a window is broken, an alarm would be emitted and/or transmitted to a remote location such as a police station or a monitoring agency.

Unfortunately, valuable personal property such as audio/visual components, computers and the like were provided with sensors such that if the item or personal property was either moved without permission or transported across a threshold, such as the perimeter of the individual's residence or place of business, an alarm would be sounded as well as alerting the police or the monitoring agency.

Additionally, during the last several years, we have witnessed an alarmingly large increase in the amount of domestic as well as international terrorism being perpetrated on innocent individuals. Although a large amount of time, effort and money has been budgeted for developing different devices, systems and methods of protecting both individuals as well as their personal property, this increase in terrorism has not abated. This is partly due to the fact that access control devices supervise access at perimeter doors, but fail to detect vandalism or terrorist threats to the exterior and the immediate vicinity of a structure or area to be protected.

Prior art security protection intrusion devices consist of a single wire cable attached to a fence or similar structure to sense vibration, noise or the actual cutting of the cable.

A number of U.S. patents have issued in the security field. For example, U.S. Pat. No. 4,213,122, issued to Rotman et al describes an intrusion detection system for protecting a metallic structure, such as an airplane, trailer, hangar or other metallic object or housing. The purpose of this patent was to secure the physical integrity of the metallic structures by detecting any attempts to penetrate through a zone or protection surrounding the metallic structures. As shown in FIGS. 1*a* and 1*b*, a radio frequency source 11, 21 would be connected to the particular metallic structure 10, 20 to be protected. The metallic structure would be surrounded by ground wires 12, 22 which in turn would be themselves surrounded by receiver wires 14, 24. The metallic structure becomes one part of a radiating antenna system producing electromagnetic fields in the surrounding receiving wires. These fields are monitored by radio frequency pickup devices which would detect any changes from a quiescent or undisturbed state. These changes would be produced by an individual crossing the receiving wires into the protective zone surrounding the metallic structures. However, as can be appreciated, directly connecting the radio frequency sources to the metallic structures could potentially cause problems to various electronic components provided in the metallic structures. Additionally, while the patent to Rotman et al would be able to sense a disturbance in the electromagnetic field surrounding the metallic structures, it would not be able to pinpoint the exact spot of this disturbance. This is particularly important when a rather large area is to be protected.

U.S. Pat. No. 4,588,988, issued to Karas describes a system for the protection of a particular secure area from intruders by sensing the deformation of a physical barrier surrounding the secure area, such as a barbed wire fence or fences shown in FIGS. 1 and 2. One or more ported coaxial cables are disposed in relation to the barbed wire fence or fences. Radio frequency sources would be connected to the coaxial cables and would be used as a source of radio frequency energy as well as for receiving reflection produced by disturbances of the electromagnetic field produced by an intruder. However, as was true with respect to the patent to Rotman et al, while the patent to Karas would sense the presence of an intruder, it could not make a determination of the exact point of entry of the intruder into the secured area. Additionally, since the radio frequencies are induced into barbed wire coils to produce the electromagnetic field, this particular configuration could not be utilized as a direct attachment to solid walls constructed from concrete, glass or brick. Even if the coaxial cables shown in the Karas patent were utilized in a manner to surround the secured area, as indicated previously, it would be ineffective to locate the point of intrusion.

U.S. Pat. No. 5,446,446 issued to Harman describes a device that uses a cable with a center conductor and one or two sense wires. Although this cable can detect the point of intrusion, it depends upon vibration and is best attached to a chain link fence. It is not effective on solid structures such as brick, block or concrete walls or similarly constructed buildings. Additionally, since this system operates on a sensed vibration, many false positive outputs could occur.

SUMMARY OF THE INVENTION

The deficiencies of the prior art are addressed by the present invention which, in its preferred embodiment, includes a cable, such as a coaxial cable, designated as a power transmission cable, in direct communication with a device for producing a radio frequency signal, such as an oscillator. A second cable, such as a coaxial cable, designated as a data cable, would be spaced from the first cable and substantially parallel to that first cable or concentric with that first cable. A plurality of radio frequency identification (RFID) chips would be attached to or incorporated into the data cable at discrete locations. Although the present invention need not operate in this manner, generally, the RFID chips would be equally spaced from one another. An electromagnetic field would be created by the power transmission cable and induced into the data cable. Each of the RFID chips would be provided with a unique address which would be continuously or intermittently transmitted to a system controller provided at one end of the data cable. If there is no interference to the electromagnetic field, all of the RFID chips would transmit its unique address to the system controller on a regular basis. However, if there is interference to the electromagnetic field caused by an intruder between the power transmission cable and the data cable, or if the power or data cable has been completely severed, one or more of the RFID chips would cease producing a signal along the data cable or while producing such a signal, it would not be received by the system controller. Therefore, based upon the information received, or not received by the system controller, the exact position of the intruder would be determined.

Other embodiments of the present invention would utilize the technology of the present invention but would provide frequency sources at both ends of the power cable as well as system controllers at both ends of the data cable. A further embodiment would utilize the teachings of the present invention by creating a closed loop configuration of both the power transmission cable as well as the data cable.

A further embodiment of the present invention would incorporate both the power cable and the data cable into a single pad of various widths, and lengths, allowing for a quick and efficient manner of deploying the intrusion detection device.

A still further embodiment of the present invention would be used to count the passage of various items on a conveyor belt or individuals passing a certain point at various events, such as a sporting contest.

Yet a further embodiment of the present invention would determine if unauthorized individuals were climbing or scaling various structures, such as trees, bridges, monuments, building walls or roofs.

A further embodiment of the present invention would utilize the power transmission cable/data cable combination to protect an area or structure by burying the cable combination underground or under water.

Yet a further embodiment of the present invention would embed the power transmission cable/data cable combination to concrete, glass, wood or other material.

Still a further embodiment of the present invention would include a data cable substantially or completely encircling an object or objects to be protected. The data cable would include a plurality of RFID chips and an electromagnetic field would be created utilizing a single omni-directional radio frequency oscillator.

A further embodiment of the present invention would affix the data cable to the top a series of poles, thereby used as an invisible fence to detect intruders.

BRIEF DESCRIPTION OF THE DRAWINGS

The foregoing aspects and other features of the present invention are explained in the following description taken in connection with the accompanying drawings wherein.

DETAILED DESCRIPTION OF THE INVENTION

Figure 1:
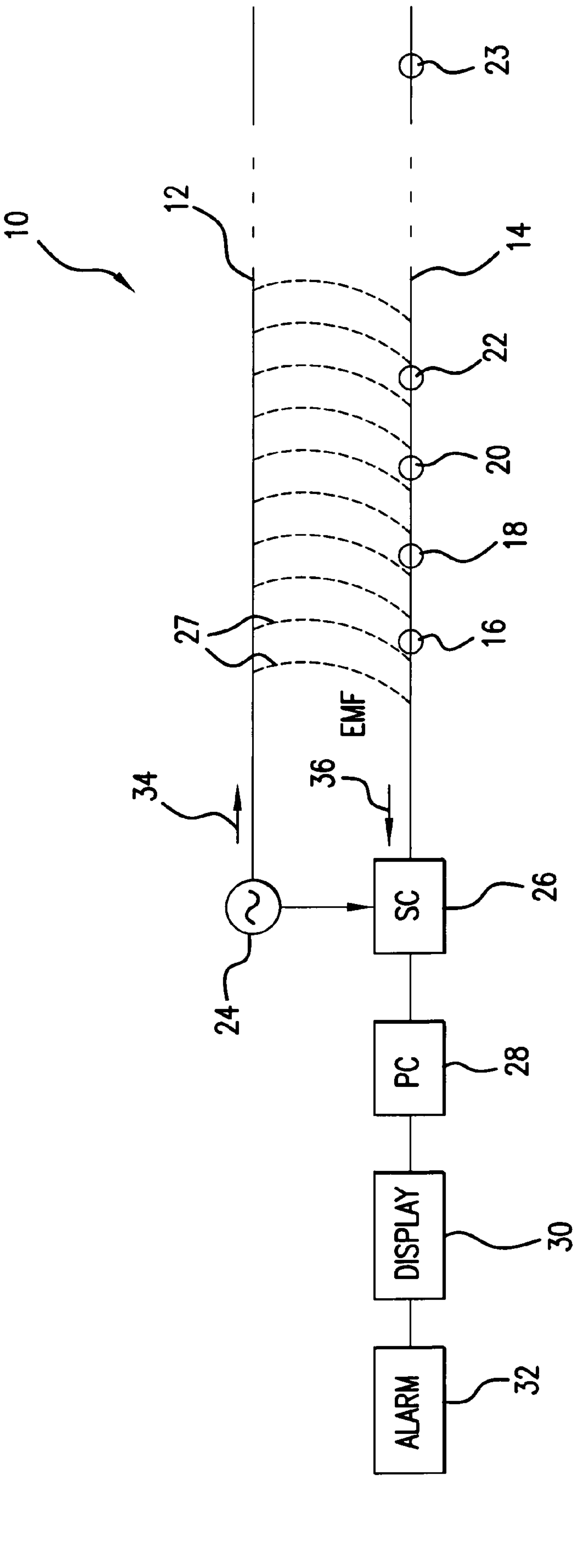
FIG. 1 is a diagram showing a first embodiment of the present invention illustrating the power transmission cable/data cable combination.

Referring to the drawings, FIG. 1 illustrates a first embodiment of the present invention used to protect against an intruder by determining whether a particular secure zone has been breached such as scaling a wall or entering into a protected environment, or by determining whether unauthorized activity is occurring on a particular object such as an individual climbing or scaling trees or structures such as bridges, monuments or the like. The invention 10 includes a power transmission cable 12, such as a coaxial cable substantially parallel to a data cable 14. The cables are separated from one another at a distance of approximately 6–24 inches or further apart depending on the frequency and power output allowed. However, it is noted that the exact space interval between the cables 12, 14 is of little importance. What is important is that the spacing would allow an electromagnetic field created by the power transmission cable 12 to be induced into the data cable 14. The data cable 14 has attached thereto or is incorporated therein with a plurality of radio frequency identification (RFID) chips 16, 18, 20, 22 and 23. Each of these chips are spaced apart from one another on the data cable 14 at particular intervals such as between 6 and 24 inches. However, as was true with respect to the spacing between the cables 12 and 14, the exact spacing between the RFID chips would be unimportant to the teachings of the present invention. The power transmission cable 12 is connected to a radio frequency signal generator 24 for producing signals in the direction of arrow 34. The transmitter 24 would generate an RF signal at various frequencies such as 125 MHz, 13.56 KHz, 900 MHz, 2.4 GHz or other frequencies allowed by the FCC for transmitting a signal through the power transmission cable 12. The transmission of the radio frequency signal through the power transmission cable 12 would produce an electromagnetic field 27, the intensity of which would be adjustable by varying the signal source 24. Consequently, the strength of the electromagnetic field could be either extended or restricted.

In the preferred embodiment, each of the RFID chips would be passive in nature and would be powered by the electromagnetic field 26. Therefore, each of the RFID chips need not include or be connected to an independent source of power. Consequently, the chips would be "sleeping" until "activated" by the electromagnetic field 26. Each of these chips, as will be later explained, would be provided with its own unique address. According to the teachings of the present invention, if there is no disturbance to the electromagnetic field, each of the RFID chips would generate a signal including its specific chip address in the direction of the arrow 36 to be received by a system controller 26. However, if there is a disturbance to the electromagnetic field created by severing either of the cables 12 or 14 or by an individual or other object coming between the cables 12 and 14 at a particular spot, the system controller 26 would not receive signals from any of the RFID chips or would receive signals from only a certain number of the RFID chips.

The system controller 26 is connected to a microprocessor such as embodied in a personal computer (PC) 28. Software, hardware or firmware, included in the system controller 26 and/or the PC 28 would be used to locate the spot of intrusion. For example, if the data cable 14 was severed at a point between RFID chip 18 and RFID 20, the system controller 26 would receive data signals from only RFID chips 16 and 18. The determination of the location of this point of severing would be ascertained by the fact that address information was received from only the RFID chips 16 and 18 and that since RFID chip 18 was furthest from the system controller 26, the point of intrusion must be between RFID chip 18 and RFID chip 20. The system controller 26 or the PC 28 would contain information allowing the exact physical location of the break or disturbance to the electromagnetic field, i.e., at a point 100 ft. from the system controller, to be determined. This would be true in the instance in which cable 12 as well as cable 14 were not severed but the electromagnetic field was disturbed between RFID chip 18 and RFID chip 20 by the presence of an unauthorized individual.

Alternatively, the spot of intrusion would be determined by the time it would take for the system controller to receive a signal from the most remote RFID chip reporter, such as chip 18 in the description of this first example. This would be accomplished since the radio frequency transmitter 24 would be in communication with the system controller 26 thereby allowing the system controller to become aware of when particular signals were being transmitted over the power cable 12, thereby creating the electromagnetic field 27, which would power each of the RFID chips. It is noted that the transmitter 24 would transmit either a continuous signal or an intermittent signal.

The PC 28 would contain or be connected to a particular display 30 which could illustrate the exact point of intrusion. The display 30 could be connected to an alarm 32 showing the specific point of intrusion within a specific zone. This alarm 32 could sound an audio alarm as well as produce a visual alarm as well as automatically informing particular individuals, such as individuals located at a security company of the occurrence as well as location of an intrusion. Based upon the information received by the system controller 26 as well as the PC 28, the exact time, date, location and duration of an intrusion would be determined and maintained in the memory of the system controller 26 or the PC 28.

The electromagnetic field created by transmitting radio frequencies through the power transmission cable 12 would allow the electromagnetic field to be created in the data cable 14 through the air as well as through various materials, such as wood, concrete, brick and glass allowing both the power transmission cable 12 and the data cable 14 to be placed behind or embedded within these or other materials, thereby protecting their integrity as well as the cable becoming less intrusive. A system according to the present invention would operate to adjust the field intensity, alarm thresholds, duration and frequency of intrusions based upon various parameters included in the microprocessor of the PC 28 as well as any microprocessor associated with the system controller 26. The filtering of parameters would allow for analog or digital reports and graphic user displays to be produced.

Figure 2:
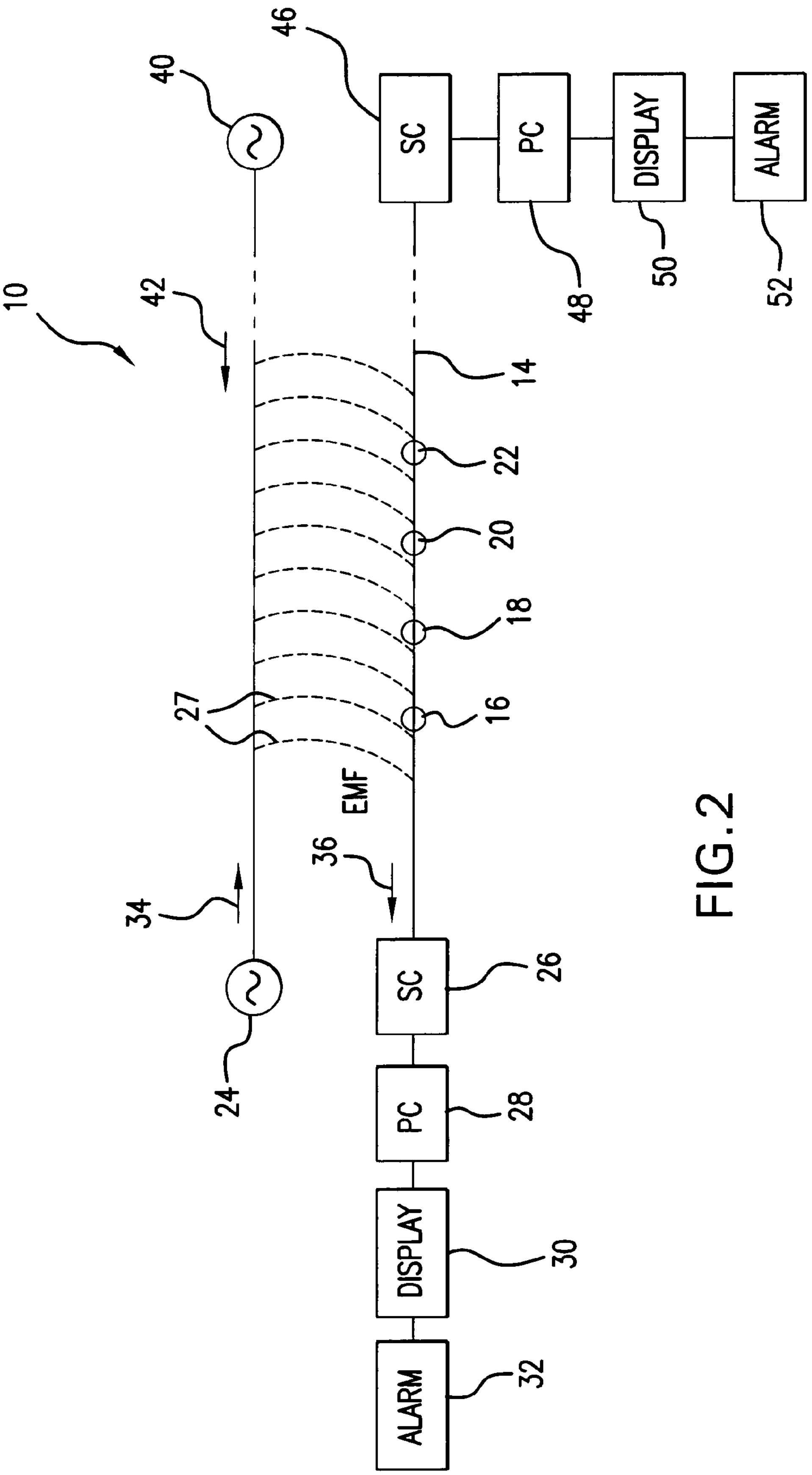
FIG. 2 is a diagram showing a second embodiment of the present invention illustrating the power transmission cable/data cable combination.

FIG. 2 illustrates an alternate embodiment of the present invention and is similar in many respects to FIG. 1. A major difference between FIG. 1 and FIG. 2 is the utilization of signal transmitters 24 and 40 provided at both ends of the cable 12. Furthermore, along with the system controller 26, PC 28, display 30 and alarm 32 provided at one end of the data cable 14 a similar system controller 46, PC 48, display 50 and alarm 52 are provided at the second end of the cable 14. In this manner, radio frequency waves would be created by both of the transmitters 24 and 40 as well as the signals produced by the RFID chips 16, 18, 20 and 22 being received by one or both of the system controllers 26 and 46. This is illustrated by showing the RF signals being transmitted in the direction of both arrows 34 and 42 and signals being received by both of the system controllers in the direction of arrows 36 and 44. Additionally, signal direction could be alternated.

Figure 3:
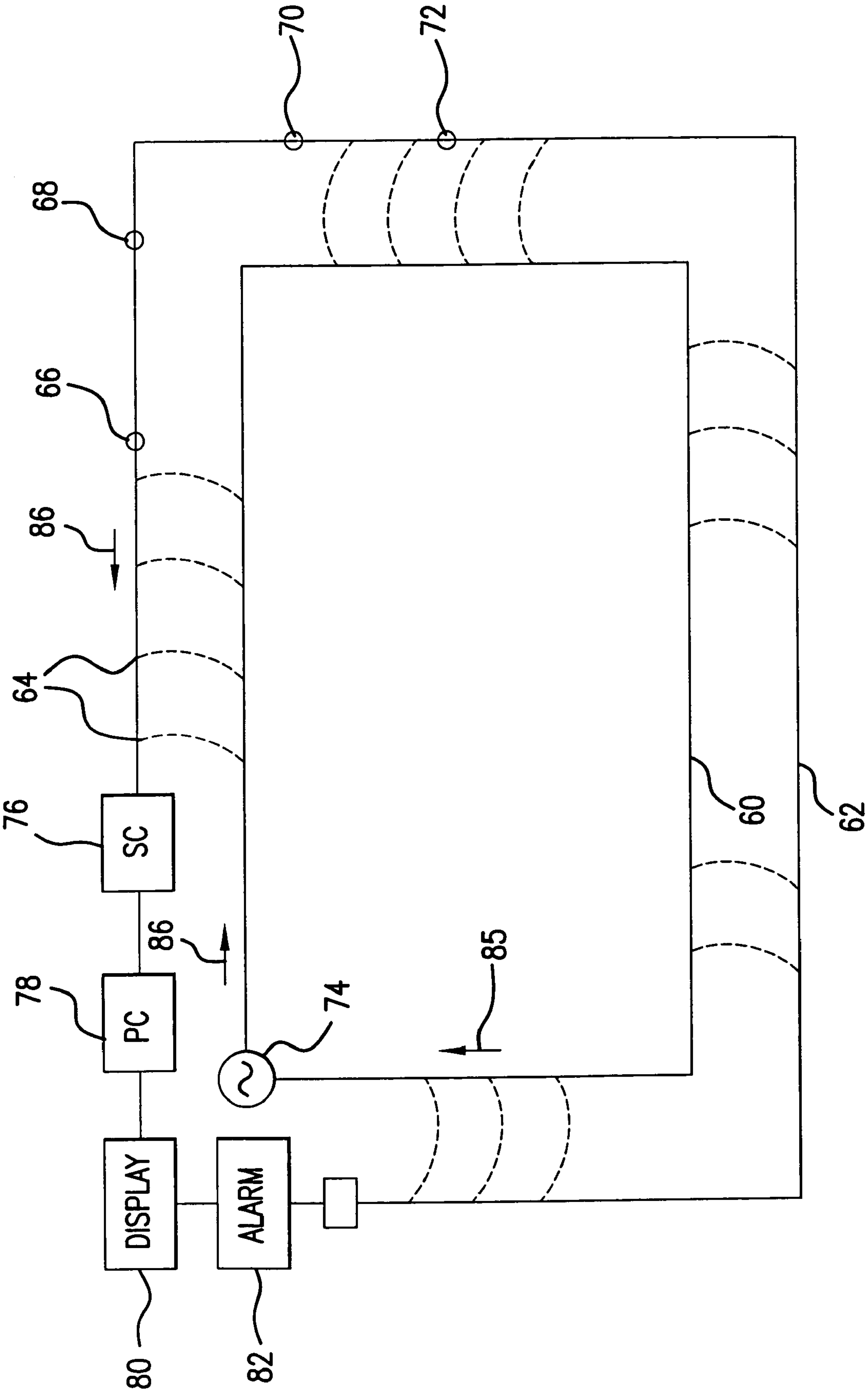
FIG. 3 is a third embodiment of the present invention showing the power transmission cable/data cable combination.

A third embodiment of the present invention is illustrated in FIG. 3 showing the device according to the present invention in a continuous loop. The embodiments shown in FIGS. 1 and 2 are primarily used to protect a structure, such as a wall which extends in a generally straight line. The embodiments illustrated with respect to FIG. 3 are primarily used to protect an enclosed area from intruders penetrating the periphery of the enclosed area as well as monitoring individuals, such as prisoners or people suffering from Alzheimer's disease or similar affiliations from leaving the enclosed area. In this embodiment, a power transmission cable 60 would be powered by a radio frequency generator 74 similar to the generator previously described. Radio frequencies would travel in the direction shown by arrows 84 and 85. The data cable 62 would be also provided in a loop. Although the data cable 62 is shown to surround the power transmission cable 60, the opposite could be true with the power transmission cable surrounding the data transmission cable. What is important is that the power transmission cable 60 at the data cable 62 be separated by distance to induce a current within the data cable 62. As shown by arrow 86, information from each of the RFID chips 66, 68, 70 and 72 would be transmitted to the system controller 76 which in turn is connected to a PC or similar device 78. The PC 78 is connected to or included with a display 80 and as was true with respect to the embodiment shown in FIGS. 1 and 2, an alarm 82 would also be included. As was true with respect to the embodiments shown in FIGS. 1 and 2, the radio frequency transmitter 74 would produce either a continuous signal or an intermittent signal creating the electromagnetic field 64, powering each of the RFID chips.

Figure 4:
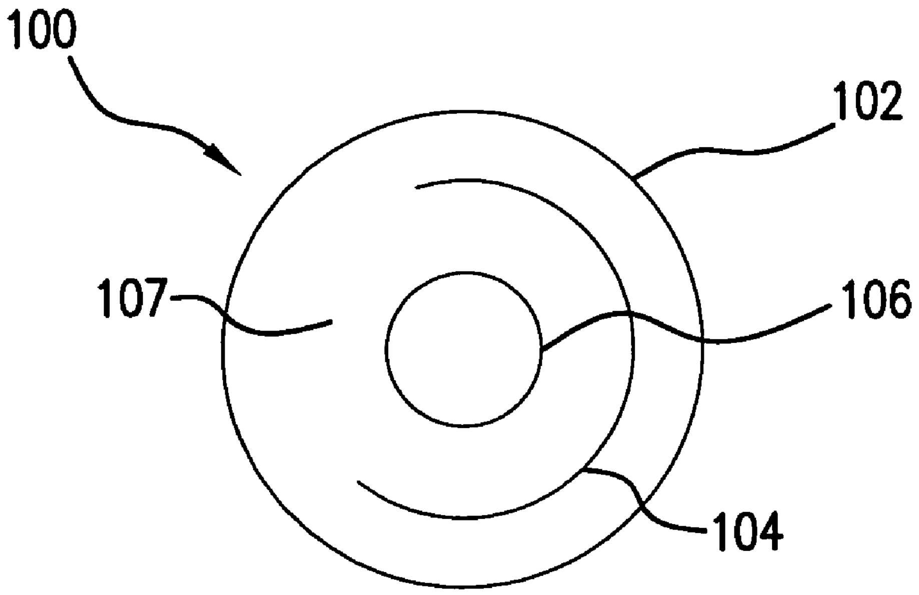
FIG. 4 shows the interior of a first embodiment of a typical power transmission cable.

A power transmission cable 100 according to the teachings of the present invention is illustrated in FIG. 4. This cable would include an outer insulated sheath 102 totally covering the cable 100 as well as a foil protective layer 104 having a window or slit 107 running the length of the cable, thereby allowing the RF signal a restricted path and concentrating the field in one direction toward the data cable. As illustrated in FIG. 4, a conductor 106 would be provided within the protective layer 104, and would be connected to a radio frequency signal source allowing an electromagnetic field to be directed through the window 107. Alternatively, the window or slit would be provided at regular intervals along the cable at positions related to the RFID chips provided in the data cable.

Figure 5:
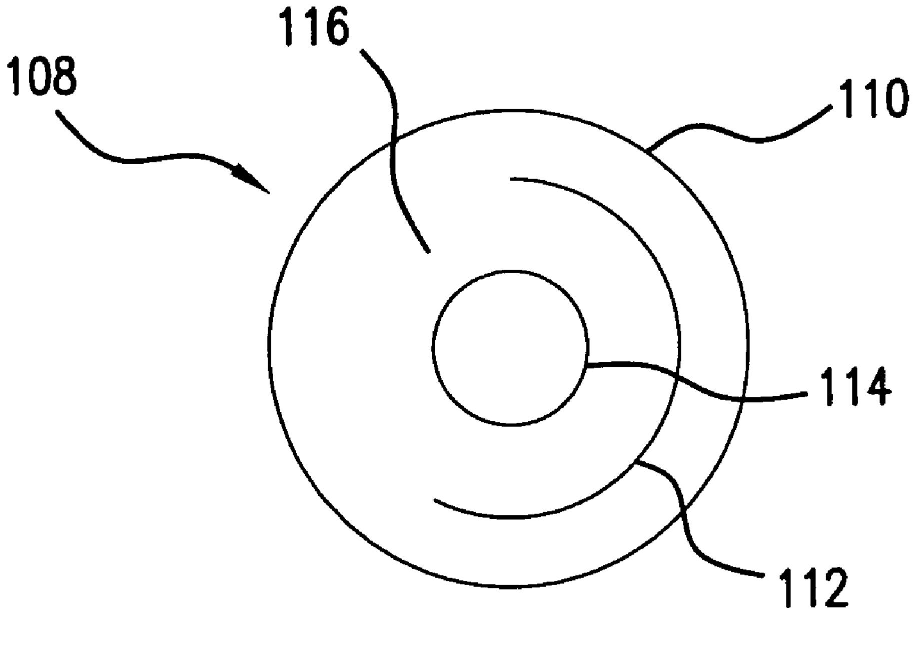
FIG. 5 shows the interior of a first embodiment of a typical data cable.

FIG. 5 shows a data cable 108 according to the teachings of the present invention. The data cable 108 is also provided with an insulated sheath 110 completely covering the cable as well as a foil protective layer 112 also provided with a slit 116 running the length of the cable, thereby allowing a data bus 114 to transmit information from the RFID chips to the system controller or controllers.

Figure 6:
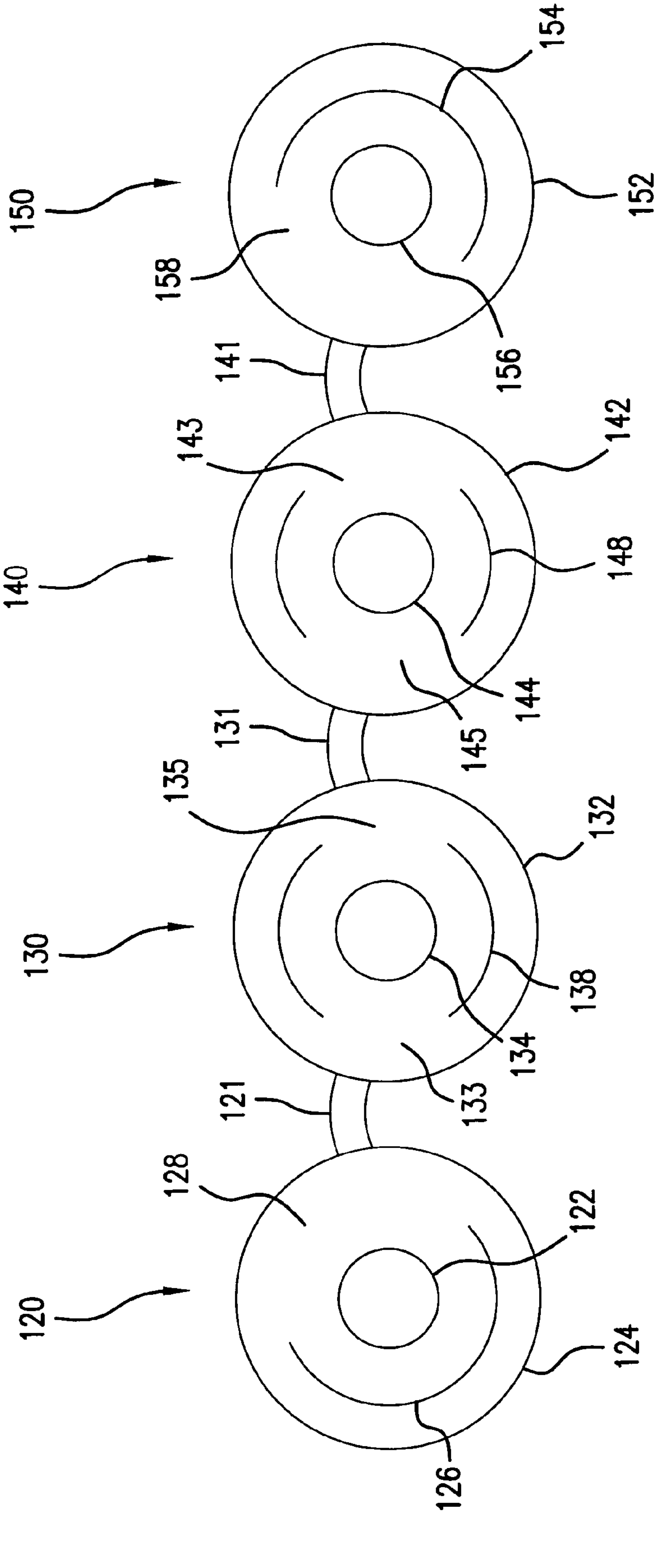
FIG. 6 shows the interior of a combination of two power transmission cables and two data cables.

FIG. 6 illustrates a situation in which power transmission cables 120 and 140 are parallel to one another. A first data transmission cable 130 is provided parallel between the two power transmission cables 120 and 140. A second data transmission cable 150 is provided next to and parallel to the second transmission cable 140. In this instance, when a radio frequency signal is produced by a suitable source, or sources, electromagnetic fields 121, 131 and 141 would be produced inducing RFID chips in the data transmission cables 120 and 150 to produce the appropriate signals to be transmitted to their respective system controller. Each of the cables 120, 130, 140 and 150 would be surrounded by its respective insulated sheath 124, 132, 142 and 152. The power transmission cable 120 would be provided with a conductor 122 and the power transmission cable 140 would be provided with a conductor 144 through both of which an RF signal is conducted. The data transmission cable 130 would include a foil sheaths 136, 138 producing windows or slits 133, 135 running the length of the cable. Similarly, the data transmission cable 150 would be provided with a conductor 156 as well as the protective foil covering 154 leaving an opening or window 158 allowing an electromagnetic current to be induced within the data cable. The power transmission cable 140 would be provided with the protective foils 146, 148, running the length of the cable 140, thereby provided with windows 143 and 145, through each of which an electromagnetic field would be directed.

Figure 7:
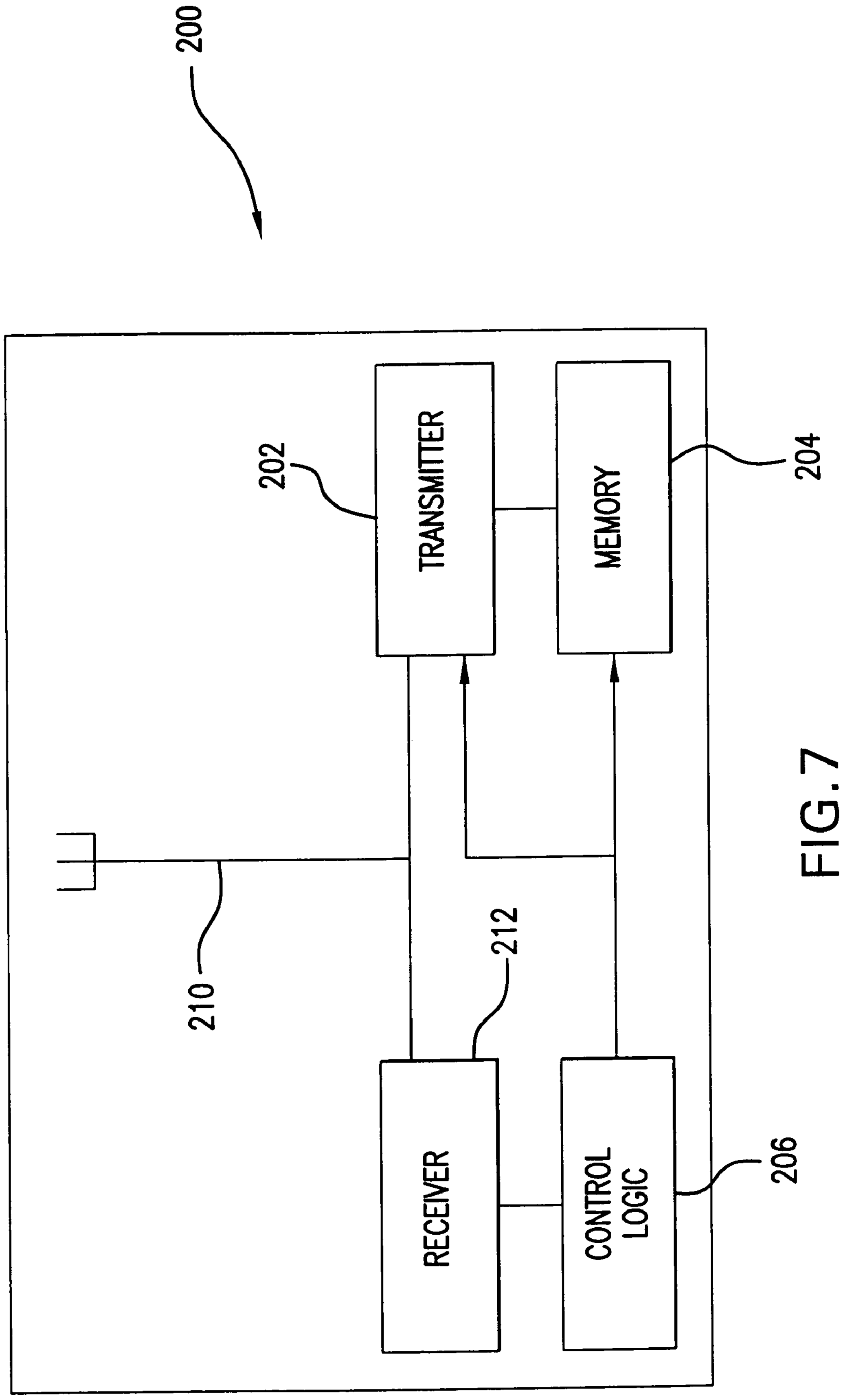
FIG. 7 shows a diagram of a typical RFID.

A typical RFID chip 200 is shown in FIG. 7. This chip would be passive in nature and would be powered by the electromagnetic field generated by one of the power transmission cables. An antenna 210 would receive the electromagnetic field and power would be directed to the receiver 212. Control logic 206 would control the operation of the RFID chip 200 thereby transmitting information, such as the RFID address contained in memory 204 to a transmitter 202 which would transmit this information through the data transmission cable acting as the antenna 210.

Figure 8:
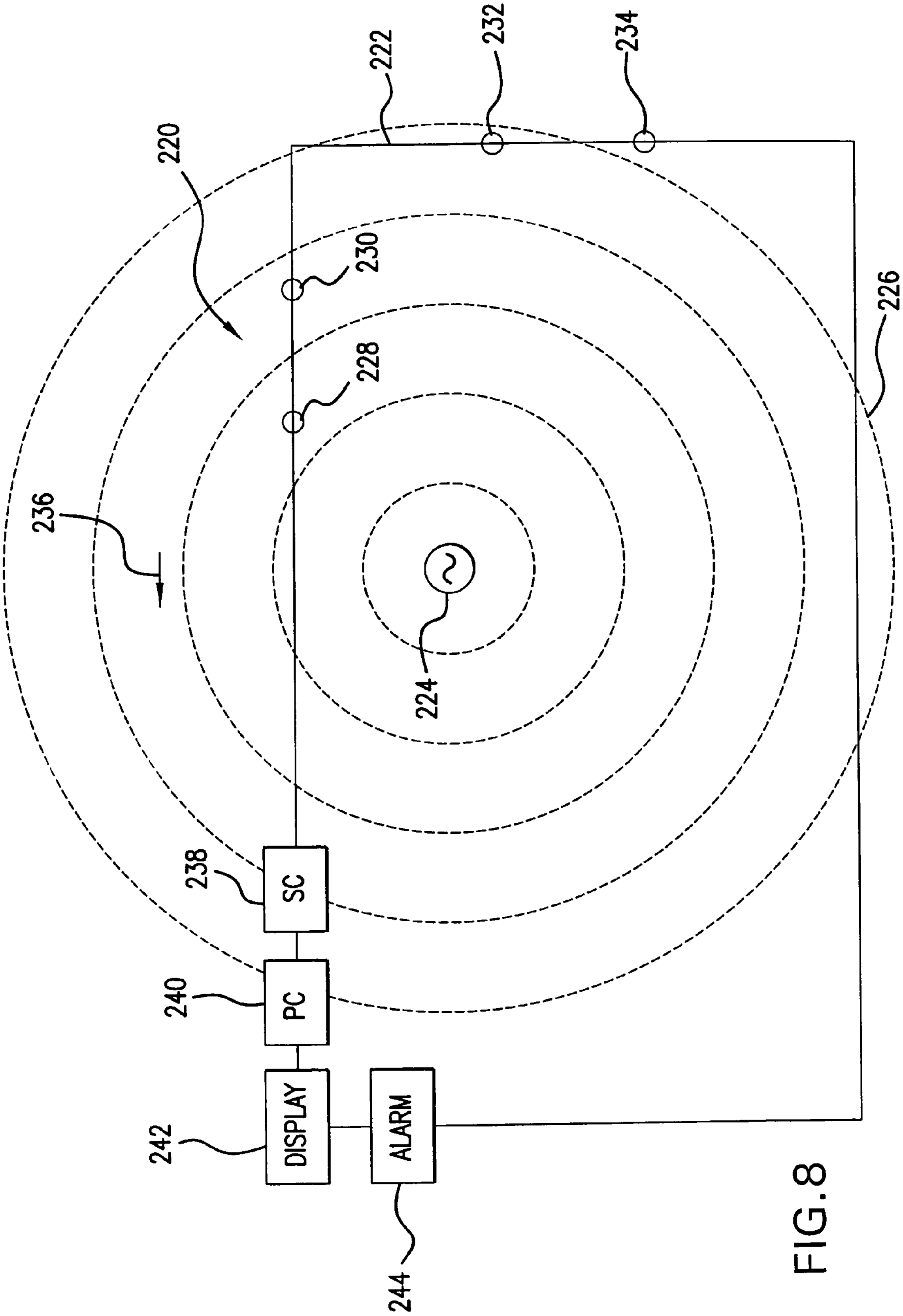
FIG. 8 is a diagram showing a further embodiment of the present invention in which the data cable surrounds an object to be protected.
Figure 9:
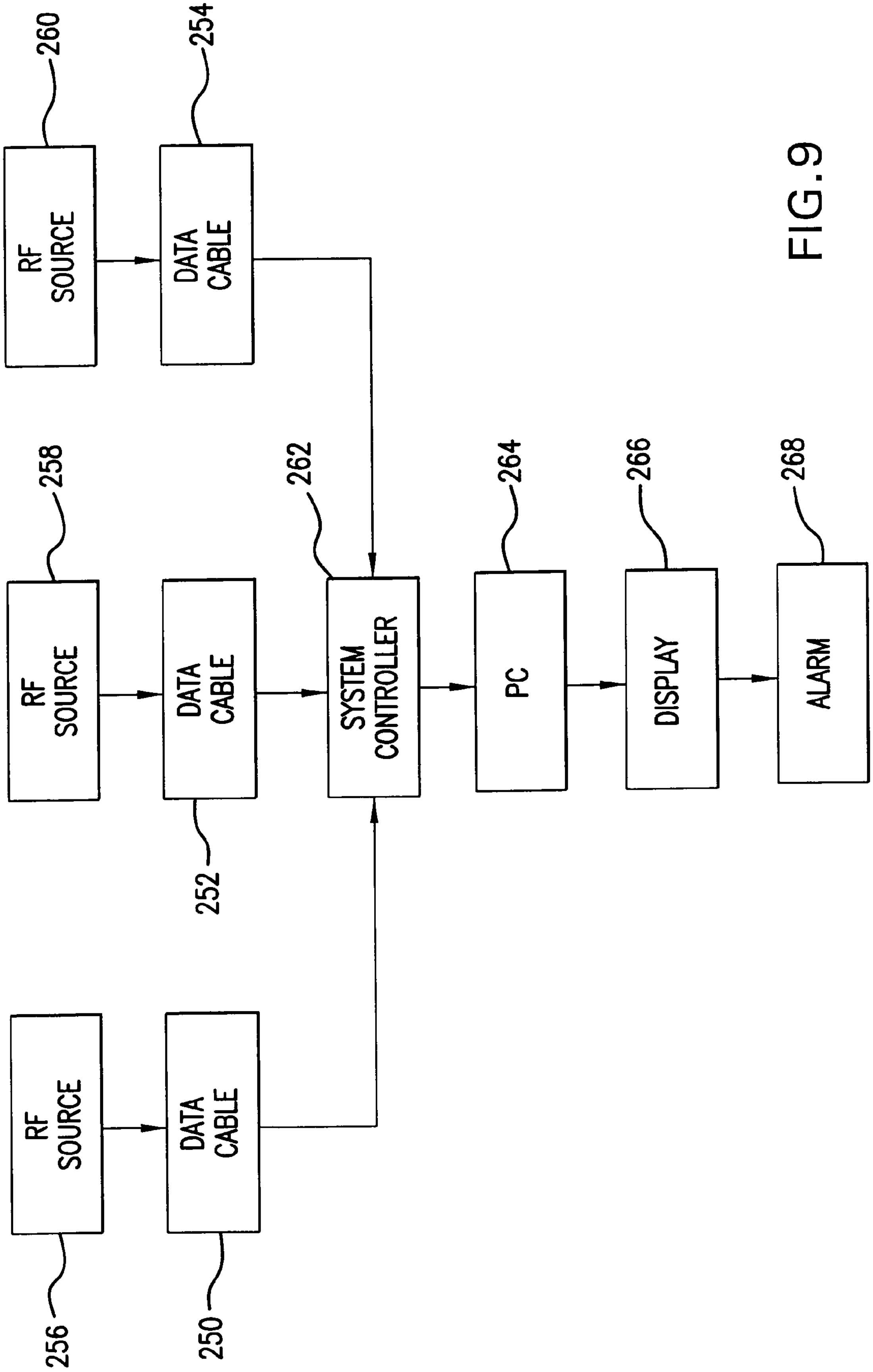
FIG. 9 is a block diagram illustrating the fourth embodiment.

A fourth embodiment of the present invention 220 is illustrated with respect to FIGS. 8 and 9. A data cable 222 would be provided with a plurality of RFID chips 228, 230, 232 and 234. Similar to the previously described embodiments, the exact number of RFID chips is unimportant. What is important is that they be provided along at least a portion of the data cable 222. The purpose of this embodiment is to protect objects from being improperly removed. These objects could include paintings or similar artwork hanging on a wall or objects, such as jewelry or antiques resting on a table. In this embodiment, the data cable 222 will surround the object or objects to be protected. In the case of protecting an object hanging on a wall, the data cable could be placed behind or embedded in the wall or placed underneath or embedded into a counter or tabletop.

A transmitter of RF frequency 224 located in the center of the data cable 22 would also be embedded in a or attached to a planar surface such as the wall or table. The transmitter 224 would radiate an RF signal producing the electromagnetic field 226. It is noted that the signal transmitter would broadcast a 360° pattern, thereby encompassing the RFID chips 228, 230, 232 and 234 of the data cable 222. Similar to the previously-described embodiments, each of the RFID chips would include a unique identification address to a system controller 238. The system controller is in communication with a personal computer 240 incorporating a display 242 or connected to a separate display. The system controller 238 and the PC 240 are, in turn, connected to an alarm 244. Any attempt to remove or disturb the protected object (not shown) would interfere with the electromagnetic field 27, and cause one or more of the RFID chips to fail to report to the system controller 238, thereby causing an alarm to be activated. Although FIG. 8 shows a hard-wired connection between the RFID chips 228, 230, 232 and 234 with the system controller noted that a wireless connection between the RFID chips and the system controller could also be utilized. In addition, similar to the previously described embodiments, the RFID chips are powered by the electromagnetic field 226 produced by the transmitter 224. When the transmitter 224 is not producing the electromagnetic field 226, the RFID chips would be in the "sleep" mode.

Furthermore, it is noted that if the item or items to be protected are metallic in nature, such as jewelry or particular types of antiques, these metallic objects would affect the electromagnetic field by absorbing a portion of this field resulting in a diminished field. This adjusted response would establish a "baseline" at the system controller 238. Therefore, the removal of that object would result in a change from the "baseline" and would result in an alarm. Consequently, in this situation, one or more of the RFID chips 228, 230, 232 and 234, would report not only its unique address to the system controller 238, but also the value of the electromagnetic field 226. In this instance, an alarm condition would be reported even if all of the RFID chips would constantly report their own unique addresses, if the strength of the electromagnetic field is less than the baseline reading.

FIG. 9 is a block diagram related to the embodiment shown in FIG. 8. The embodiment shown in FIG. 8 illustrates a situation in which a single radio frequency source creates an electromagnetic field encompassing a single set of RFID chips provided in a single data cable used to protect one or more objects associated with the single data cable. FIG. 9 illustrates the situation in which a single system controller 262 is used to supervise the operation of several data cables 250, 252 and 254 protecting desparate articles or objects. Each of the data cables 250, 252 and 254 would be provided with a plurality of RFID chips, each chip transmitting its own unique address to the system controller 262 when the chips are in the presence of an electromagnetic field. In this situation, separate radio frequency sources 256, 258 and 260 would produce their own separate electromagnetic fields encompassing the objects to be protected as well as its own respective data cables 250, 252 and 254. Therefore, in the presence of an electromagnetic field, the RFID chips would transmit its own unique address to the single system controller 262. This system controller would be in communication with a PC 264, a display 266, an alarm 268 similar to the system illustrated in FIG. 8. Since the system controller 262 and/or the PC 264 would be provided with a memory in which the location of each of the RFID chips will be located, the failure to receive one or more signals from the RFID chips would result an alarm condition being observed in one or more of the data cables. Similar to the embodiment shown in FIG. 8, the data cables 250, 252 and 254 could be hardwired to the system controller 262 or, in the alternative, a wireless connection could be utilized.

Figure 10:
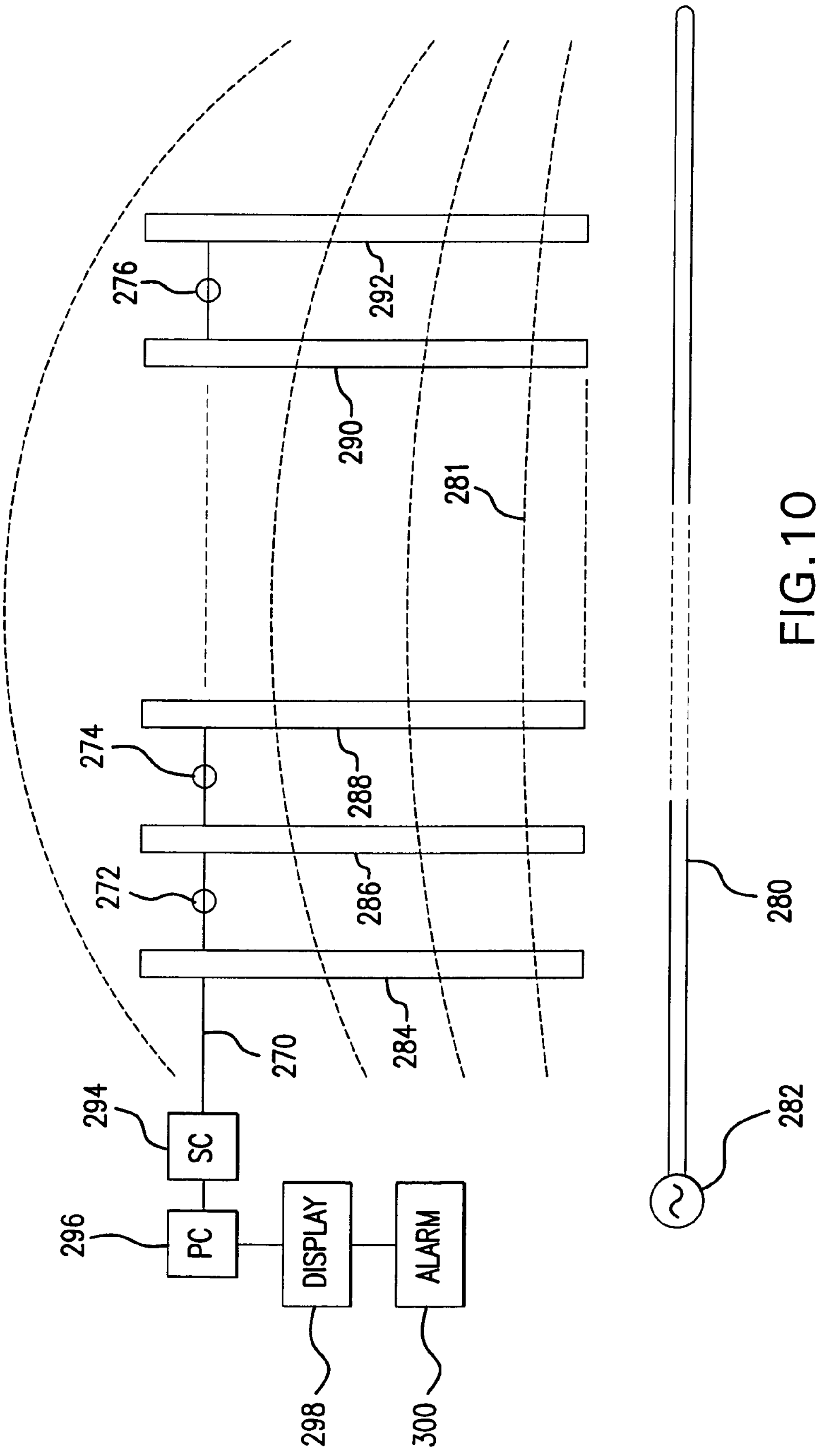
FIG. 10 is a diagram showing a fifth embodiment of the present invention in which the data cable is attached to the top of a plurality of upstanding poles.

Referring to FIG. 10, a fifth embodiment of the present invention would act as a "invisible" fence provided on the periphery of at least one side of a protected property. Alternatively, the "invisible" fence could completely surround the protected property. In this embodiment, a data cable 270 containing a plurality of RFID chips 272, 274 and 276 would be attached to, or strung from, a plurality of vertical posts 284, 286, 288, 290 and 292. These posts would be provided on or near the periphery of at least one side of a protected property. These vertical posts could be in the form of telephone or other types of communication poles as well as light posts. The RFID chips would be similar in nature to the RFID chips previously described and illustrated with respect to FIG. 7.

A power transmission cable 280 is connected to a radio frequency signal generator 282 for producing signals creating an electromagnetic field 281. The cable 280 could lie on the ground near the poles 284, 286, 288, 290 and 292. Alternatively, the cable 280 could be buried in the ground, thereby helping to hide its existence. The cable 280 could be formulated with a single window slit running the length of the cable or with a plurality of windows periodically arranged on the cable 280. In both of these instances, the transmitted signal would be directed upward, thereby creating an electromagnetic field which would enclose the data cable 270 and the RFID chips 270, 272, 274 and 276.

The data cable 270, similar to the previously-described embodiments, would be connected to a systems controller 294, which in turn would be connected to a PC 296, a display 298 and an alarm system 300.

The electromagnetic field 281 would awake the RFID chips from the "sleep" mode, allowing each of the RFID chips 272, 274 and 276 to produce a unique address signal transmitted from the data cable 270 to the system controller 294. It is noted that the data cable 270 could be directly hard-wired to the system controller 294 or a wireless communication could be created between the data cable 270 and the systems controller 294. Normally, if there is no obstruction to the electromagnetic field 281 created by an intruder or intruders, each of the RFID chips 272, 274 and 276 would continuously or intermittently transmit its unique identification code to the systems controller 294. However, if one or more intruders would disrupt the electromagnetic field 281 beneath one or more of the RFID chips, it would interrupt the transmission of the unique address from one or more of the RFID chips to the system controller 294. The appropriate lack of receipt of one or more of the unique chip addresses would result in the determination that an alarm situation has occurred as well as specify the location or locations of an intruder. Since this particular embodiment is designed to sense an intruder entering a protected piece of property between the poles 284, 286, 288, 290 and 292, it is noted that each of the RFID chips 272, 274 and 276 are located between two of the poles. Although the exact dimensions are not crucial to the present invention, it is noted that the data cable including the RFID chips are attached to the top of the poles at approximately eight to ten feet from the ground with the poles spaced approximately 30 to 40 feet apart.

A further adaptation of the present invention would mount a data cable including a plurality of RFID chips on the outside perimeter of a ship. The associated power transmission cable connected to a radio frequency source would create an electromagnetic field encompassing the ship and the data cable. This embodiment would detect the unauthorized boarding of the ship at any location of the ship.

Having described the intrusion detection system according to the present invention, the method of utilizing such a system to monitor either entry or exit from a particular secured environment as well as determining whether various structures or trees are being mounted or scaled will be described. When used to protect a particular structure such as a building, chemical storage tanks, gas lines, oil lines or other types of pipelines, a power transmission cable is embedded in the particular structure, pipeline or the like, or is buried parallel to the structure. The data transmission cable is embedded into the particular structure or buried in the ground parallel to the power transmission cable in a manner to provide a protected environment next to the structure or, in the case of a building or similar structure surrounding that building or similar structure. The data cable would be provided with a plurality of RFID chips along the entire length of the data cable or along at least one portion of the data cable. The data cable would be connected to the system controller which in turn would be connected to a PC having a display incorporated therein as well as possibly being connected to an alarm. A radio frequency generator such as an oscillator is connected to the power transmission cable and would produce either a continuous or intermittent signal. Particularly when an intermittent signal is produced, the radio frequency transmitter would be connected to the system controller allowing the system controller to monitor the location of the signals received by the system controller. Since each of the RFID chips is provided with an unique address, the system controller by itself or in conjunction with the PC would be able to determine whether there was an intrusion and the exact location of that intrusion.

If the system is operating properly, and there is no intrusion, the system controller should receive signals on a continuous or intermittent basis from all of the RFID chips. However, if an intrusion is sensed, or the power transmission cable or data cable would be severed, the system controller would not receive signals from any of the RFID chips beyond the location of the intrusion. The exact location of this intrusion would be pinpointed by the system controller either by being provided in its memory or its associated PC the exact physical location of each of the RFID chips or by determining this position utilizing the sensed time between transmitting an RF signal by the radio frequency transmitter and receiving a signal from the RFID chip immediately in front of the point of intrusion.

For ease of installation, the power transmission cable as well as the data cable would be incorporated into a single pad of various widths and lengths, these pads being either buried in the ground or embedded in various materials, such as glass, wood, concrete and other radio frequency acceptable materials. Similarly, if an area was to be protected, the power transmission/data cable combination would be embedded in or surround the entire area.

Along with its utilization in the field of intrusion detection and protection, the present invention could be utilized in various other environments. For example, the present invention could be utilized to count the number of individuals entering a certain area, such as a sporting event or a ship. In this instance, the power transmission cable would be provided on one side of a gate or gang plank and the data cable would be provided on the second side of the gate or gang plank. Thereafter, a continuous signal would be transmitted over the power transmission cable to induce an electromagnetic field between the power transmission cable and the data cable, thereby inducing a current in the data cable. The system controller and PC connected to the data cable would be able to count the number of interferences within the electromagnetic field, each interference due to an individual passing through the gate or gang plank.

Similarly, the present invention could be utilized in conjunction with a conveyor belt. For example, if the power transmission cable is provided on one side of the belt and the data cable is provided on the other side of the belt parallel to the power transmission cable, discrete items being transported on the conveyor belt could be counted. Additionally, with respect to a continuous item being transported on the conveyor belt, the sensing of a signal produced by one of the RFID chips would indicate the complete passage of that continuous item.

Additionally, the present invention could be utilized in conjunction with determining whether a particular portable item such as an electrical appliance or a firearm would interfere with the electromagnetic field in a manner to decrease the intensity of the field, thereby resulting in an alarm to be produced.

It is to be understood that the above-described embodiment of the invention are illustrative only, and that modifications thereof may occur to those skilled in the art. For example, although the present invention is illustrated in the drawings is provided with a separate system controller and PC, these two devices could be incorporated into a single entity. Accordingly, this invention is not to be regarded as limited to the embodiments disclosed herein.

What is claimed is:

1. A device for sensing the occurrence of an event, comprising:

a power transmission cable;

a data cable spaced apart from said power cable;

a plurality of identification chips spaced apart from each other along said data cable;

a source of radio frequency signals connected to said power transmission cable creating an electromagnetic field inducing a current in said plurality of identification chips, thereby allowing a signal to be broadcast from each of said identification chips along said data cable; and a system controller in communication with said data cable for receiving signals broadcast from said identification chips, wherein the lack of receipt of a signal from one or more of said identification chips is indicative of the occurrence of the event.

2. The device in accordance with claim 1, further including software, hardware or firmware provided in a memory provided in said system controller for determining the exact position along said data cable of the occurrence of the event.

3. The device in accordance with claim 2, wherein each of said identification chips is provided with a separate memory, into which an unique address is stored, said unique address of each of said identification chips transmitted toward said system controller along said data cable when said electromagnetic field induces a current in each of said identification chips.

4. The device in accordance with claim 3 wherein said source of radio frequency signals and said system controller are in direct communication with one another.

5. The device in accordance with claim 3, wherein the event is an intrusion and the device further including an alarm in communication with said system controller indicating the presence of an intrusion.

6. The device in accordance with claim 5, wherein both said power transmission cable and said data cable surround a protection zone.

7. The device in accordance with claim 6, further including a display in communication with said system controller displaying the protection zone thereon and the exact presence of the intrusion.

8. The device in accordance with claim 2, wherein the event is an intrusion and the device further including an alarm in communication with said system controller indicating the presence of an intrusion.

9. The device in accordance with claim 8, wherein both said power transmission cable and said data cable surround a protection zone.

10. The device in accordance with claim 9, further including a display in communication with said system controller displaying the protection zone thereon and the exact presence of the intrusion.

11. The device in accordance with claim 3, wherein said power transmission cable produces an omni-directional electromagnetic field.

12. The device in accordance with claim 11, wherein the event is the removal of an object provided within the electromagnetic field, and further wherein said data cable encircles the object.

13. The device in accordance with claim 12, including a plurality of data cables spaced apart from said power cable, each of said data cables provided with a plurality of identification chips, wherein said system controller is in cormnunication with each of said data cables.

14. The device in accordance with claim 13, including a plurality of data cables spaced apart from said power cable and a plurality of system controllers, each data cable in communication with a separate system controller.

15. The device in accordance with claim 14, further including a separate power transmission cable associated with each of said plurality of data cables.

16. The device in accordance with claim 13, further including a separate power transmission cable associated with each of said plurality of data cables.

17. The device in accordance with claim 12 wherein each of said identification chips transmits a signal to said system controller of the electromagnetic field sensed by each of said identification chips.

18. The device in accordance with claim 1, wherein said power transmission cable and said data cable including said identification chips are embedded within a structure to be protected.

19. The device in accordance with claim 1, wherein the event is the passage of a person or item between said power transmission cable and said data cable.

20. The device in accordance with claim 19, further including a second power transmission cable and a second data cable each provided between said power transmission cable and said data cable, said second power transmission cable including a second power transmission cable and a foil protective cover partially surrounding said power transmission conductor, creating two power transmission cable windows extending for the entire length of said second power transmission cable, and further wherein said second data cable includes a conductor extending for the entire length of said second data cable and a foil protective cover extending for the entire length of said second data cable, and partially surrounding said second data cable conductor, creating the data cable windows extending for the entire length of said second data cable.

21. The device in accordance with claim 1, wherein said power transmission cable includes a power transmission conductor extending for the entire length of said power transmission cable and a foil protective cover extending for the entire length of said power transmission cable, partially surrounding said power transmission conductor, creating a power transmission cable window extending for the entire length of said power transmission cable, and further wherein said data cable includes a conductor extending for the entire length of said data cable and a foil protective cover extending for the entire length of said data cable, and partially surrounding said data cable conductor, creating a data cable window extending for the entire length of said data cable, said power transmission cable window facing said data cable window.

22. A method of detecting the occurrence of an event, including the steps of:

installing a power transmission cable;

installing a data cable spaced from said power transmission cable, said data cable provided with a plurality of identification chips spaced apart from one another;

transmitting a radio frequency signal along said power transmission cable, thereby creating an electromagnetic field and inducing a current in each of said identification chips, allowing each of said identification chips to broadcast a signal along said data cable, when a current is induced in each of said identification chips;

receiving each of said signals produced by said identification chips in a system controller connected to said data cable; and determining the occurrence of an event based upon the signals received by said system controller.

23. The method in accordance with claim 22, wherein the event is an intrusion, the position of which is determined by the lack of signals received by said system controller of said identification chips located beyond the point of intrusion.

24. The method in accordance with claim 23, including the steps of:

assigning an unique address to each of said identification chips;

storing separate unique addresses in each of said identification chips; and transmitting each of said unique addresses along said data cable to said system controller when current is induced in each of said identification chips.

25. The method in accordance with claim 22, wherein the event is counting the occurrence of an object or person passing between said power transmission cable and said data cable, including the steps of:

transmitting a continuous radio frequency signal along said power transmission cable; and counting the number of disturbances of said electromagnetic field based upon the number of signal received by said controller from one of said identification chips.

26. The method in accordance with claim 22, further including the steps of periodically sensing the strength of the electromagnetic field and periodically transmitting the strength of the electromagnetic field to said system controller.

27. A device for sensing an intrusion onto a piece of property having a plurality of vertical poles provided along at least a portion of the property, comprising:

a data cable attached to the vertical poles at an elevated distance above the ground;

a plurality of identification chips spaced apart from each other along said data cable;

a power transmission cable spaced from said data cable;

a source of radio frequency signals connected to said power transmission cable creating an electromagnetic field inducing a current in said plurality of identification chips, thereby allowing a signal to be broadcast from each of said identification chips along said data cable; and a system controller in connection with said data cable for receiving signals broadcast from said identification chips, wherein the lack of receipt of a signal from one or more of said identification chips is indicative of the presence of an intruder on the piece of property.

28. The device in accordance with claim 27, wherein each of said identification chips is provided between adjacent vertical poles.

* * * * *